United States Patent
Noori et al.

(10) Patent No.: US 9,929,701 B1
(45) Date of Patent: Mar. 27, 2018

(54) LNA WITH PROGRAMMABLE LINEARITY

(71) Applicant: Peregrine Semiconductor Corporation, San Diego, CA (US)

(72) Inventors: Hossein Noori, San Diego, CA (US); Chih-Chieh Cheng, Poway, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/272,103

(22) Filed: Sep. 21, 2016

(51) Int. Cl.
| H03F 1/22 | (2006.01) |
| H03F 1/32 | (2006.01) |
| H03F 1/56 | (2006.01) |
| H03F 3/195 | (2006.01) |
| H03G 3/00 | (2006.01) |
| H03G 3/10 | (2006.01) |

(52) U.S. Cl.
CPC ............ *H03F 1/3205* (2013.01); *H03F 1/56* (2013.01); *H03F 3/195* (2013.01); *H03G 3/008* (2013.01); *H03G 3/10* (2013.01); *H03F 2200/294* (2013.01); *H03F 2200/387* (2013.01); *H03F 2200/451* (2013.01); *H03F 2200/72* (2013.01); *H03F 2200/75* (2013.01); *H03G 2201/307* (2013.01)

(58) Field of Classification Search
CPC . H03F 1/22; H03F 1/223; H03F 1/226; H03F 3/68
USPC ........................................... 330/51, 295, 311
See application file for complete search history.

(56) References Cited

U.S. PATENT DOCUMENTS

| 6,472,936 B1* | 10/2002 | Jones | H03F 1/22 |
| | | | 330/286 |
| 7,495,515 B1* | 2/2009 | Branch | H03F 1/56 |
| | | | 330/302 |
| 8,237,503 B2* | 8/2012 | He | H04B 1/0483 |
| | | | 330/124 R |
| 9,035,697 B2* | 5/2015 | Youssef | H03F 3/68 |
| | | | 330/311 |
| 9,407,215 B2 | 8/2016 | Gill | |
| 2007/0024377 A1* | 2/2007 | Wang | H03F 1/42 |
| | | | 330/305 |
| 2010/0041361 A1 | 2/2010 | Ojo | |
| 2010/0237945 A1 | 9/2010 | Cassia et al. | |

(Continued)

OTHER PUBLICATIONS

Gundlach, Susanne, Invitation to Pay Additional Fees and, Where Applicable, Protest Fee received from the dated Oct. 20, 2017 for appln. No. PCT/US2017/043403, 15 pgs.

(Continued)

*Primary Examiner* — Steven J Mottola
(74) *Attorney, Agent, or Firm* — Jaquez Land Greenhaus LLP; Martin J. Jaquez, Esq.; Bruce W. Greenhaus, Esq.

(57) ABSTRACT

A receiver front end capable of receiving and processing intraband non-contiguous carrier aggregate (CA) signals using multiple low noise amplifiers (LNAs) is disclosed herein. A cascode having a "common source" input stage and a "common gate" output stage can be turned on or off using the gate of the output stage. A first switch is provided that allows a connection to be either established or broken between the source terminal of the input stage of each cascode. Further switches used for switching degeneration inductors, gate/sources caps and gate to ground caps for each legs can be used to further improve the matching performance of the invention.

7 Claims, 8 Drawing Sheets

(56) References Cited

U.S. PATENT DOCUMENTS

| | | | |
|---|---|---|---|
| 2011/0018635 A1* | 1/2011 | Tasic | H03F 1/223 |
| | | | 330/277 |
| 2011/0070848 A1 | 3/2011 | Ramachandra Reddy | |
| 2014/0203872 A1* | 7/2014 | Sjoland | H03F 1/303 |
| | | | 330/252 |
| 2015/0230185 A1 | 8/2015 | Vahid Far et al. | |
| 2016/0065264 A1 | 3/2016 | Wu et al. | |

OTHER PUBLICATIONS

Gundlach, Susanne, International Search Report and Written Opinion received from the EPO dated Jan. 12, 2018 for appln. No. PCT/US2017/043403, 23 pgs.

* cited by examiner

LNA WITH PROGRAMMABLE LINEARITY

BACKGROUND

(1) Technical Field

Various embodiments described herein relate to amplifiers, and more particularly, to low-noise amplifiers for use in communications equipment.

(2) Background

The front-end of a communications receiver typically includes an amplifier, such as a low-noise amplifier ("LNA"). The LNA is responsible for providing the first-stage amplification to a signal received by the communications receiver. The operational specifications of the LNA are very important to the overall quality of the communications receiver. Any noise or distortion introduced by the LNA will cause a degradation in the overall receiver performance. That is, the sensitivity of a receiver is in large part determined by the quality of the front-end, and in particular, by the quality of the LNA. The sensitivity of the receiver, in turn, determines the amount of information that can be transmitted in a predetermined amount of time (e.g., the bit rate in bits per second) at a predetermined bit error rate.

The quality of an LNA is often times characterized by parameters such as the gain, linearity (i.e., third-order intercept point (IP3) and the 1 dB compression point (P1 dB)), noise figure (NF), input impedance match, output impedance match, and the power consumption (i.e., supply voltage and current). These characteristics indicate the amount of distortion likely to be imposed on signals received through the front-end, how strong a signal needs to be and the signal-to-interference-plus-noise ratio (SINR) required to recover information transmitted at a particular data rate. Demand continues to grow for ever higher data rates. High data rates require greater accuracy in the demodulation of signals received by today's receivers. Limitations on the amount of gain that can be applied without imposition of excessive distortion by the front-end of the receiver can limit the data rate at which information modulated on a signal can be accurately demodulated from the signal once received.

In the case of receivers used in wireless communications, such as receivers within cellular telephones, the receiver front-end must also be capable of handling a wide range of input signal levels. Accordingly, state of the art LNAs must have programmable gain, current and linearity. In addition, they must maintain good input and output impedance matching for maximum power transfer with minimum distortion and a low noise figure when the LNA operates at different bias current levels and gain modes.

FIG. 1 shows a simplified illustration of one such state of the art radio frequency (RF) receiver front end 100 having a one-stage cascode common-source LNA 102. Typically, such a state of the art LNA is designed for the "high gain" and "high bias current" mode of operation. Accordingly, the input/output impedance is matched for the high-gain and high-bias-current mode. For lower gain and bias current modes, the current is simply reduced. In addition to reducing the bias current, output and/or input attenuators are used to further reduce the gain.

In the case of RF front-ends for high-end mobile phones, manufacturers require that the LNA operate in different gain and current modes with specified linearity and noise figure. In particular, some manufacturers require the LNA to operate in four gain modes: 21 dB, 18 dB, 12 dB and 0 dB. These gain modes typically have bias currents of 10 mA, 8 mA, 6 mA, and 2 mA, respectively. The noise figure requirement for each mode may be 1 dB, 1.2 dB, 3.4 dB and 11.4 dB, respectively. In addition, the linearity for each mode may be specified in terms of an input third-order intercept (IIP3) of −8 dBm, −8 dBm, −6 dBm and 10.5 dBm, respectively.

In the RF front-end 100 shown in FIG. 1, an RF input signal is coupled to the front-end 100 through an input attenuator module 104. The input attenuator module 104 may be a variable impedance attenuator 106, such as a continuously-variable attenuator or a step attenuator. The input attenuator module 104 typically comprises a bypass switch 108. Accordingly, the input signal can be applied directly to the input of an impedance matching and bias network without attenuation. The impedance matching and bias network 110 comprises an input matching inductor 112, a dc-blocking capacitor 114, a bias resistor 116, a variable bias voltage source 118 and a bypass capacitor 120.

The RF input signal is then coupled to the input of the LNA 102 (i.e., the gate of a first field effect transistor (FET) 122 within the LNA 102). A degeneration inductor 124 is coupled to the source of the FET 122. The drain of the FET 122 is coupled to the source of a second FET 126. The gate of the second FET 126 is coupled to a variable bias voltage source 128 and a bypass capacitor 130. The drain of the second FET 126 is coupled to a load inductor 132, an output impedance matching network 134 and a bypass capacitor 135. An output attenuator module 136 comprising a variable attenuator 138, such as a continuously-variable attenuator or a step attenuator, and a bypass switch 139 couples the output signal to the RF front-end output port 140.

The gain of the LNA 102 can be controlled by adjusting a combination of the resistance imposed by the input attenuator module 108, the resistance imposed by the output attenuator module 136, the bias voltage applied to the gate of the first FET 122 and the bias voltage applied to the gate of the second FET 126. That is, by reducing the bias current in each of the FETs 122, 126 of the LNA 102 and adding attenuation to the input and output of the LNA 102, the gain of the RF front end 100 is reduced. However, there are several disadvantages to reducing the gain in this manner.

First, reducing the bias current to force the LNA 102 to operate at lower gain degrades the linearity of the LNA 102. In addition, operating at lower LNA bias current severely degrades the input impedance matching, causing gain, linearity and noise figure degradation. Adding attenuation to the output assists in reducing the gain, but does not result in any improvement in the linearity of the LNA 102. The input attenuator, on the other hand, does improve the impedance match at the input and the linearity for low gain and high noise figure modes of operation. However, the resulting degradation in the noise figure makes it difficult to increase the input impedance for some gain modes, making it impractical in modes that require a low noise figure.

Furthermore, using attenuator modules requires a relatively large area in the physical layout of an RF front-end 100. In addition, attenuator modules tend to add parasitic capacitance at the input and output, resulting in degradation in the input and output matching, which results in distortion and makes the LNA 102 less efficient. Because the gain range may be as great as 24 dB, a large number of input and output attenuators are required. This complicates the design and, as noted above, significantly increases the die area required to fabricate the LNA 102.

Lastly, in low gain modes, the reduction in the bias current can lead to the LNA 102 moving out of the saturation region. When this happens, there is a significant degradation in the linearity of the LNA 102.

Therefore, there is currently a need for an RF receiver front-end that can operate in several gain, linearity, and/or bias current modes while maintaining reasonable noise figure, and with relatively little change to the input and output impedance.

SUMMARY OF THE INVENTION

A receiver front-end is disclosed that is capable of receiving RF input signals having a broad range of signal levels and operating in a variety of gain and current modes that cover a large gain range. The receiver front-end comprises an amplifier, such as a low-noise amplifier (LNA). The receiver operates in a plurality of gain and current modes. The receiver operates at a low noise figure, high third-order intercept point (IP3), and with little difference in the input and output impedance of the front-end over the range of gain and current modes. In accordance with some embodiments of the disclosed method and apparatus, the LNA maintains a relatively constant current density through the FETs of the amplifier in all gain modes. In order to maintain the same current density, the LNA's Common-Source amplifier (also known as driver) and Common-Gate amplifier (also known as cascode) are split into a plurality of amplifier branches, each having a "binary-weight". In some embodiments, the binary weight is a function of FET width. As a result, each branch of the LNA carries a current that is proportional to a binary value. Accordingly, each branch will have a gain having a binary-weight. This allows branches to be turned on in various combinations to allow selection of a total bias current across the LNA without changing the bias current of any particular branch (other than to turn the branch on or off).

In some embodiments, a bank of input capacitors can be switched in cooperation with the selection of the amplifier branches (i.e., selection of the gain mode) to ensure that the reactance at the input of the LNA (i.e., the imaginary part of the input impedance) is the same in each gain mode. When selected, the input capacitors are placed between the gate and source of the driver FETs of the LNA.

Furthermore, in some embodiments, a second bank of input capacitors can be switched in cooperation with the selection of the amplifier branches to ensure that the impedance at the input of the LNA is the same for each gain mode.

Still further, in some embodiments, a selectable bank of "gain control" resistive elements can be placed in parallel with a load inductor to further reduce the gain of the LNA. In some embodiments, changes to the output impedance resulting from adding or subtracting the gain control resistive elements can be offset by adding or subtracting capacitance in parallel with an output impedance matching capacitor using a selectable bank of gain control compensation capacitors.

Still further, in some embodiments, a bank of output capacitors can be selected in cooperation with the selection of the amplifier branches (i.e., selection of the gain mode). Selection of the output capacitors ensures that the capacitive reactance at the output of the LNA is the same in each gain mode. When selected, the output capacitors are placed in parallel with the load inductor.

Lastly, in some embodiments, a post fabrication variable gate to source capacitance is provided to allow measurements of parameters of interest regarding the LNA to be made based on post fabrication tuning of the gate to source capacitance and different bias voltages for the FET of the LNA.

The details of one or more embodiments of the disclosed method and apparatus are set forth in the accompanying drawings and the description below. Other features, objects, and advantages of the disclosed method and apparatus will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 1:
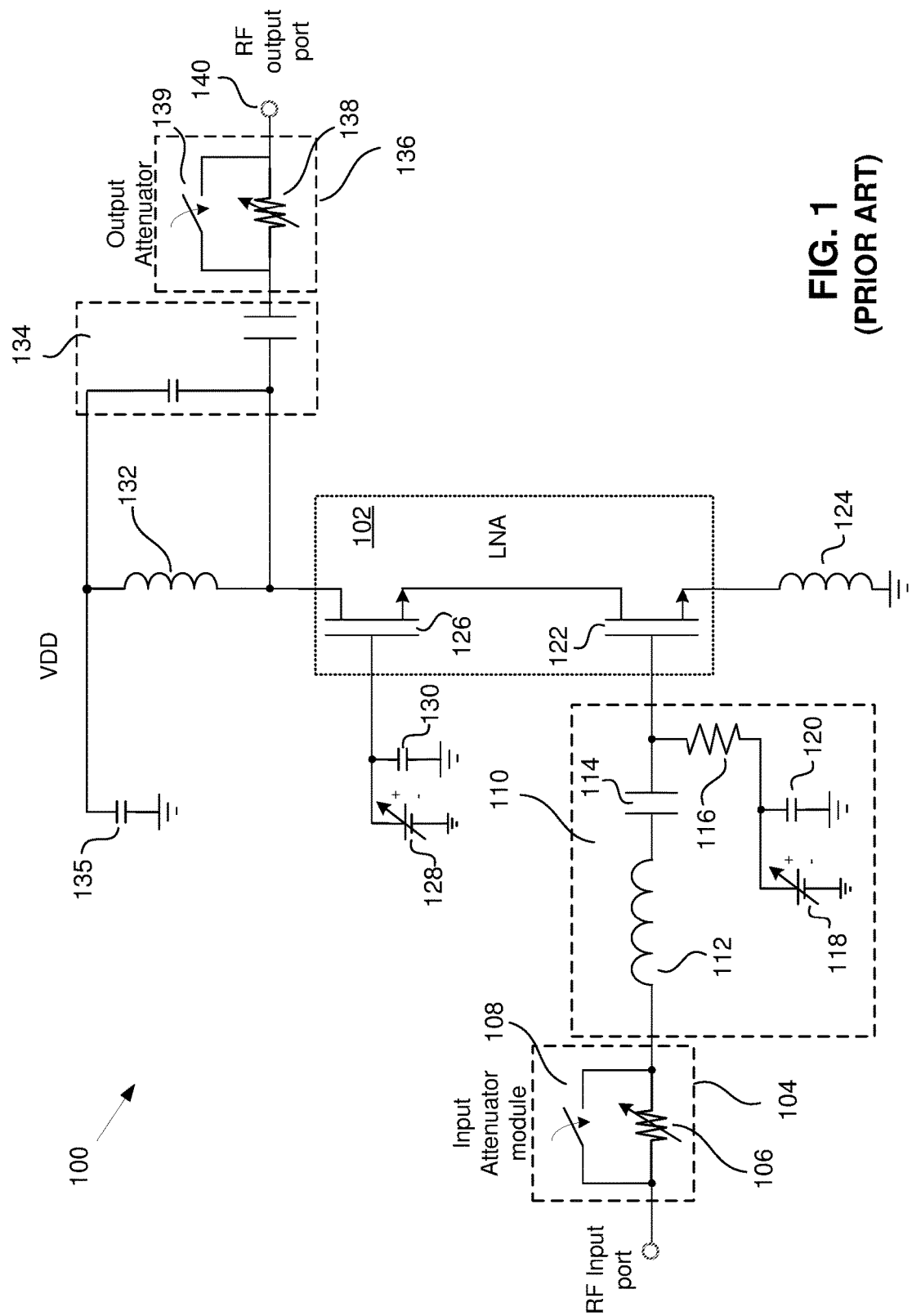
FIG. 1 is an illustration of an LNA of a prior art communications receiver.
Figure 2:
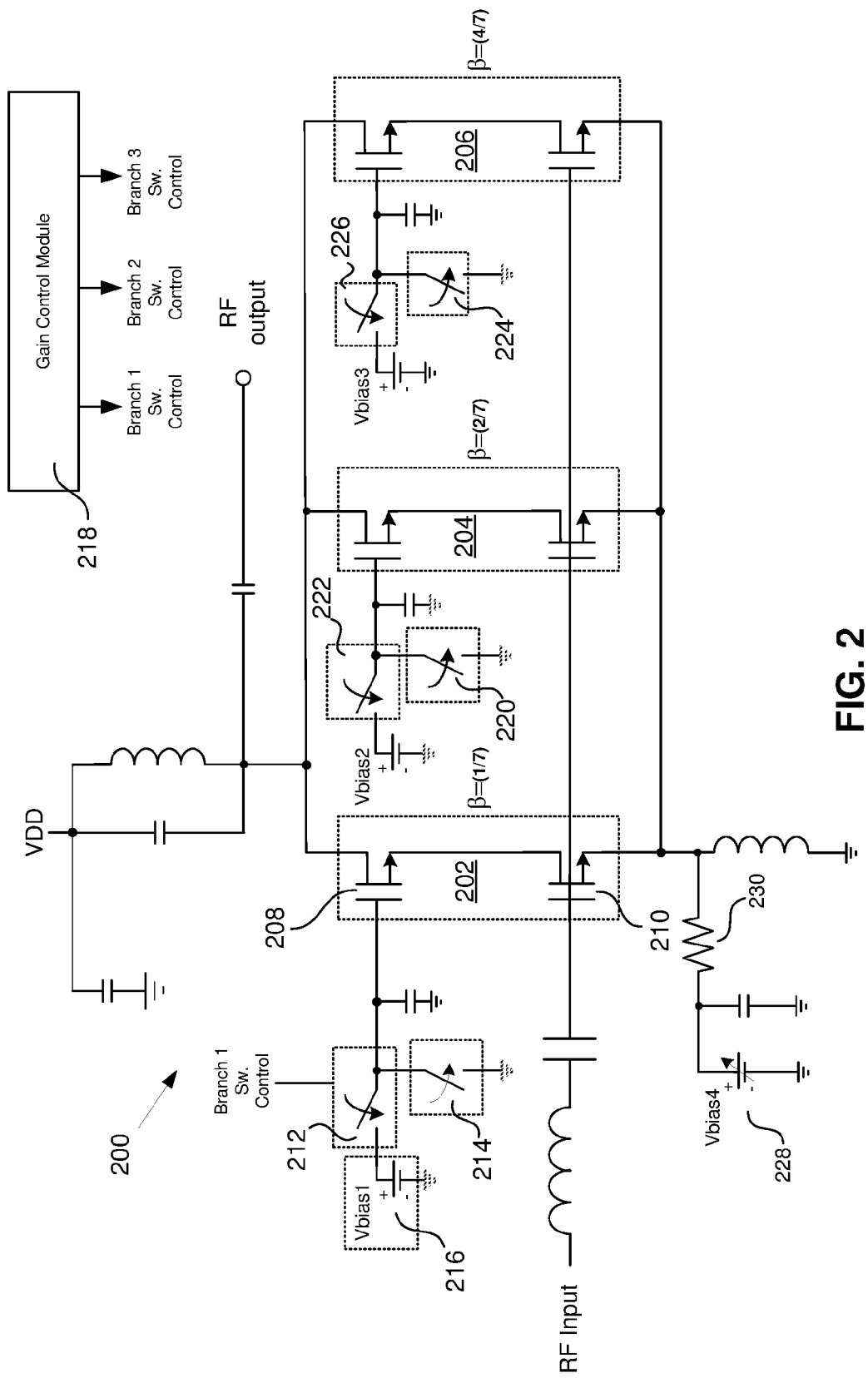
FIG. 2 is an illustration of an LNA of a communications receiver capable of operating in several gain and current modes.

FIG. 2 is an illustration of an LNA 200 of one example of a communications receiver capable of operating in several gain modes. The LNA 200 comprises a plurality of amplifier branches 202, 204, 206, each branch having an amplifier. The inputs to each of the amplifier branches are coupled together. In some embodiments, a first FET 210 is configured as a common-source amplifier (i.e., "driver") and a second FET 208 is configured as a common-gate amplifier (i.e., "cascode"). Alternatively, each amplifier branch can be configured as a single common source device or a stack of FET devices. In some embodiments, the branches include combinations of the above configurations. For the sake of simplicity, a cascode LNA is described in more detail below. However, it should be understood that the following description applies equally to other configurations of amplifier branches.

In some embodiments, each branch 202, 204, 206 has a "binary-weight" $\beta$. Accordingly, in some such embodiments, the width of the FETs 208, 210 in each branch 202, 204, 206 is proportional to the binary weight $\beta$ of that branch. Accordingly, in some such embodiments, the gain of each branch is also proportional to $\beta$ (i.e., each branch has a binary-weighted gain). In other embodiments, the relative weight of the branches may be distributed differently, such as in a thermometer weighting, geometric or logarithmic weighting, arbitrary weighting or other weighting scheme.

In the case of a binary weighting scheme, the binary weight β of each branch is $2^{i-1}/(2^{(n)}-1)$, where i is the branch number from 1 to n, and n is the total number of branches. In this example, the LNA 200 comprises a total of three branches 202, 204, 206. Therefore, the value of n is 3. The value of i for the first branch is 1. Therefore, the weight β of the first branch is $2^0/2^{(3)}-1)=1/7$. The value of i for the second branch is 2, thus the weight β of the second branch is $2^1/(2^{(3)}-1))=2/7$. The value of i for the third branch is 3, thus the weight β of the third branch is $2^2/(2^{(3)}-1)=4/7$. The number of branches will depend upon the granularity of weighting steps desired, as will be clear from the following description. In some embodiments, the gain of each branch 202, 204, 206 is proportional to the weight β of that branch. In other embodiments, other parameters, such as current, noise contribution, delivered output power, linearity level, etc. could be the primary metric that is weighted.

In some embodiments, the gain of each branch is set by establishing the width of the two FETs 208, 210 proportional to β. That is, the width of the FET 210 of the first branch is $1/7^{th}$ the width of the amplifier FET that would be needed to achieve the same gain in a conventional LNA that has just one such driver FET (i.e., one branch). Similarly, the width of the FET 208 of the first branch is $1/7^{th}$ the width of a cascode amplifier FET that would be needed to achieve the same gain in a conventional LNA having just one such cascode FET.

The width of the FET 210 of the second branch is $2/7^{th}$ the width of the driver amplifier FET that would needed to achieve the same gain in a conventional LNA. It should be clear that the width of each other FET 208, 210 is proportional to the binary weight β of the branch in which the FET 208, 210 resides.

A pair of branch control switches 212, 214 associated with the first branch 202 controls the bias to the gate of the cascode FET 208 of that branch. A branch 1 switch control signal coupled to the switch 212 controls when the switch is to be opened and closed. For the sake of simplicity, only the switch 212 is shown having a branch switch control signals coupled thereto. However, each of the other branch control switches 214, 220, 222, 224, 226 is controlled by a corresponding switch control signal.

By opening the switch 212 to a bias voltage source 216 and closing the switch 214 to ground, the bias is removed from the gate of a cascode FET 208. Accordingly, the drain current Id flowing through the branch is turned off, essentially removing that branch from operation and reducing the gain contribution of that branch to the overall gain of the LNA 200 to zero. Similarly, pair of switches 220, 222, 224, 226 associated with the other two branches, respectively, turns those branches on and off. In some embodiments, a gain control module produces branch switch control signals that are coupled to switches 212, 214, 220, 222, 224, 226 to allow the gain control module to turn each branch on or off, depending upon the amount of gain desired. The LNA can thus be operated in steps of $1/7^{th}$ the maximum gain. That is, with only the first branch 202 turned on, the LNA 200 will operate at $1/7^{th}$ maximum gain. With only the second branch turned on, the LNA 200 will operate at $2/7^{th}$ maximum gain. With both the first and the second branch turned on, the LNA 200 will operate at $3/7^{th}$ maximum. With only the third branch turned on, the LNA 200 will operate at $4/7^{th}$ maximum gain, etc.

Splitting the LNA 200 into several branches allows the bias current through each FET 208, 210 to remain constant at a bias current level at which the branch was designed to operate.

When a branch 202, 204, 206 is turned OFF, its common-gate amplifier formed by the cascode (FET 208 for branch 202, for example) is turned OFF by grounding its gate. Thus, the FET 208 does not draw current. However, in some embodiments, the common-source amplifier formed by the cascode FET 210 is not OFF. Rather, that FET 210 is in "triode" mode, as its gate is still biased. Therefore, as the different branches are turned on and off, the input impedance of the LNA 200 may change. As noted above, this is undesirable. This is mitigated in some embodiments, in which the input impedance of the LNA 200 is maintained constant for different gain modes (i.e., with different combinations of branches being turned on).

Figure 3:
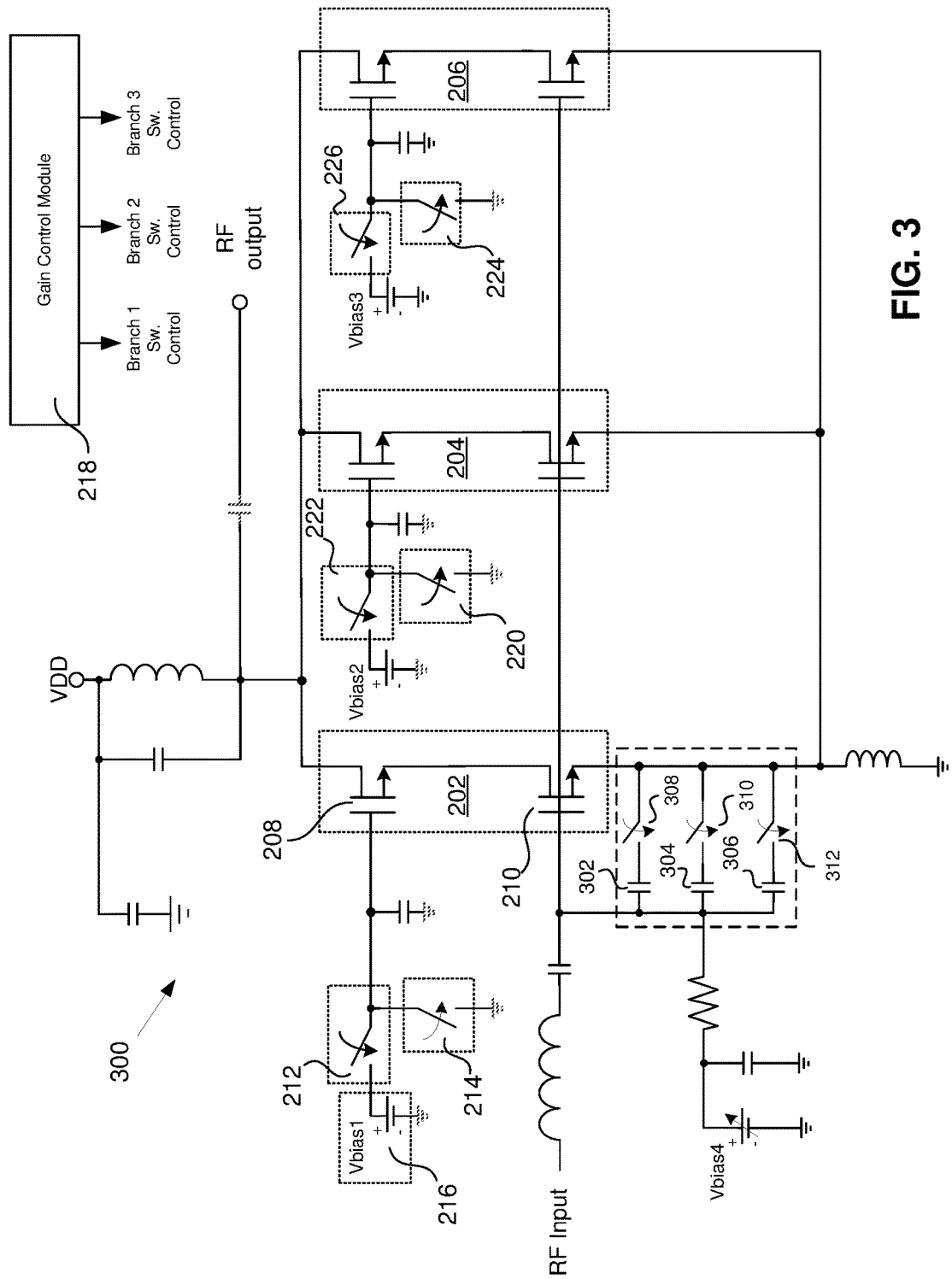
FIG. 3 illustrates the LNA of FIG. 2, having a bank of input capacitors that can be selectively placed between a gate and a source of the common source FETs of the amplifier branches of the LNA.

FIG. 3 is an illustration of one embodiment of an LNA 300 similar to the LNA 200 shown in FIG. 2. However, the LNA 300 shown in FIG. 3 comprises a bank of selectable gate-to-source compensation capacitors (GSC Caps) 302, 304, 306. Each GSC Cap 302, 304, 306 corresponds with one of the branches 202, 204, 206 of the LNA 200. Each GSC Cap 302, 304, 306 is coupled to a GSC Cap switch 308, 310, 312 to allow the GSC 302, 304, 306 Cap to be selected. The gate to source capacitance $C_{gs}$ within a FET changes depending on whether the FET is in the saturation mode or triode mode, thereby changing the input impedance of the LNA 300. In some embodiments, the capacitance of each of the GSC Caps 302, 304, 306 is set equal to the difference between the $C_{gs}$ of the FET 210 in saturation and the $C_{gs}$ of the FET 210 in triode mode. Combinations of the GCS Caps 302, 304, 306 are thus selected to mitigate changes in the input impedance in each of the possible gain modes. That is, the resulting change in the input reactance of the LNA 300 due to the change of the $C_{gs}$ of FETs 210 from saturation mode to triode mode can be mitigated (and essentially eliminated) by closing the GSC Cap switch 308, 310, 312 associated with those branches that are turned off.

In some embodiments, each of the GSC Cap switches 308, 310, 312 are controlled by the gain control module 218, such that the GSC Cap switch 308, 310, 312 coupled to the GSC Cap 302, 304, 306 is closed when the corresponding branch 202, 204, 206 of the LNA 200 is turned off. The GSC Cap switch is then opened when the corresponding branch is turned on. Adding capacitance between the gate and the source of the driver FETs 202, 204, 206 of the LNA 300 compensates for the difference between the input impedance in each of the different operational modes.

Figure 4:
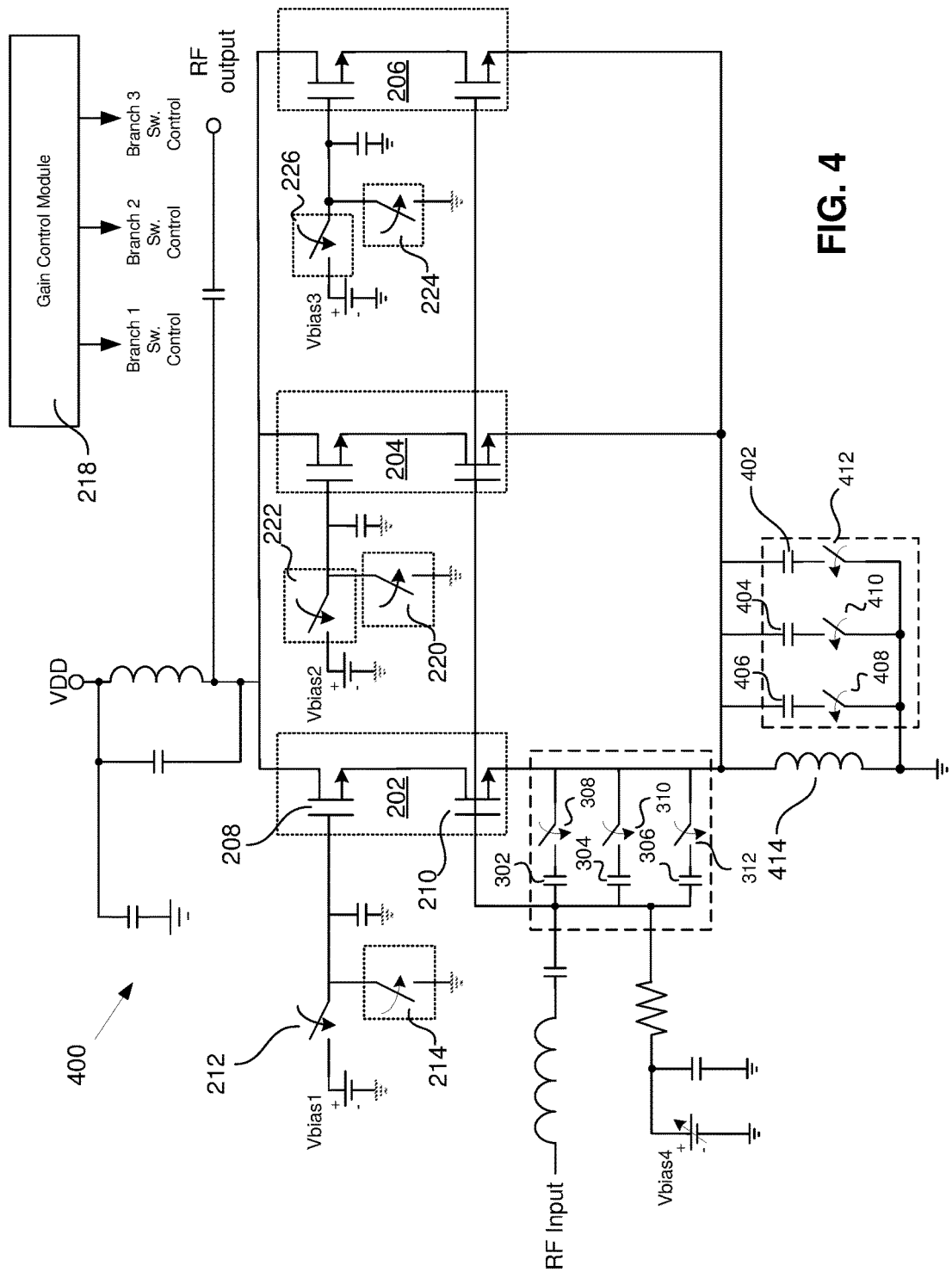
FIG. 4 is an illustration of the LNA of FIG. 3, the LNA additionally having a second bank of input capacitors selectively placed in parallel with a degeneration inductor.

FIG. 4 illustrates an LNA 400 having a bank of degeneration capacitors 402, 404, 406. Similar to the first bank of capacitors 302, 304, 306, the bank of degeneration capacitors 402, 404, 406 are switched in and out of the circuit in coordination with the selection of the gain mode of the LNA 400. In some embodiments, the switching is controlled by a gain control module 218 as disclosed above. By closing the associated switches 408, 410, 412 one or more of the capacitors 402, 404, 406 are placed in parallel with the degeneration inductor 414. By changing the amount of capacitance in parallel with the degeneration inductor 414 as the LNA 400 changes gain modes, the total input impedance that is seen looking into the input of the LNA 400 can be adjusted so that the input impedance remains essentially constant for each gain mode. Accordingly, the degeneration capacitors 402, 404, 406 are tuned to keep the input impedance the same in each of the possible gain modes. Note that a first of the three switches 408 is associated with the switches 214, 220 associated with the first branch 202, as well as with a first of the three switches 308. Therefore, when the first branch is turned on, switches 308, 408 are opened. Likewise, when the second branch 204 is turned on, the switches 310, 410 are opened. Finally, when the third branch 206 is turned on, the switches 312, 412 are opened.

Figure 5:
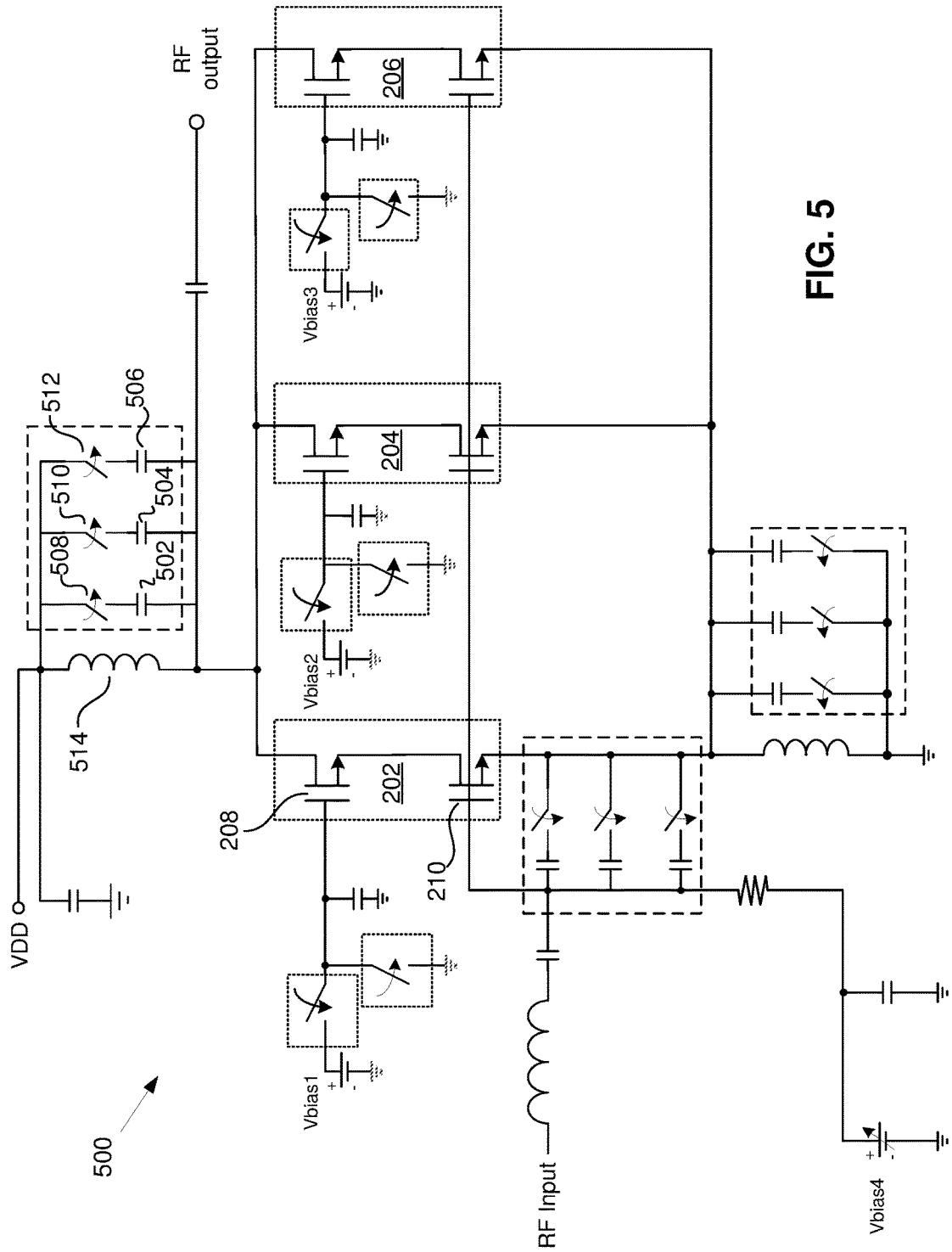
FIG. 5 is an illustration of the LNA of FIG. 4, additionally having compensation provided to ensure that the output impedance of the LNA remains constant in each gain mode.

FIG. 5 is an illustration of yet another embodiment of an LNA 500 in which compensation is provided to ensure that the output impedance of the LNA 500 remains constant in each gain mode. The LNA 500 has a load inductor 514 coupled between a voltage supply VDD and the drains of the common-gate FETs 208. The compensation for changes that would otherwise occur in the output impedance is provided by a third bank of output impedance compensation (OIC) capacitors 502, 504, 506 that can each be placed in parallel with the load inductor 514 by closing an associated switch 508, 510, 512. That is, when a branch 202, 204, 206 of the LNA is turned off, the output impedance decreases. This results in an output impedance mismatch. By providing additional capacitor in parallel with the load impedance 514 when a branch is turned off, the mismatch can be improved. Accordingly, each of the three switches 508, 510, 512 are associated with one of the three branches 202, 204, 206. When a branch 202, 204, 206 is turned off, the associated switch 508, 510, 512 is closed. As was the case in the LNAs 400, 300 discussed above, a gain control module 218 (not shown in FIG. 5 to simplify the figure) can be provided to control and coordinate the operation of the branches 202, 204, 206 and the switches.

Figure 6:
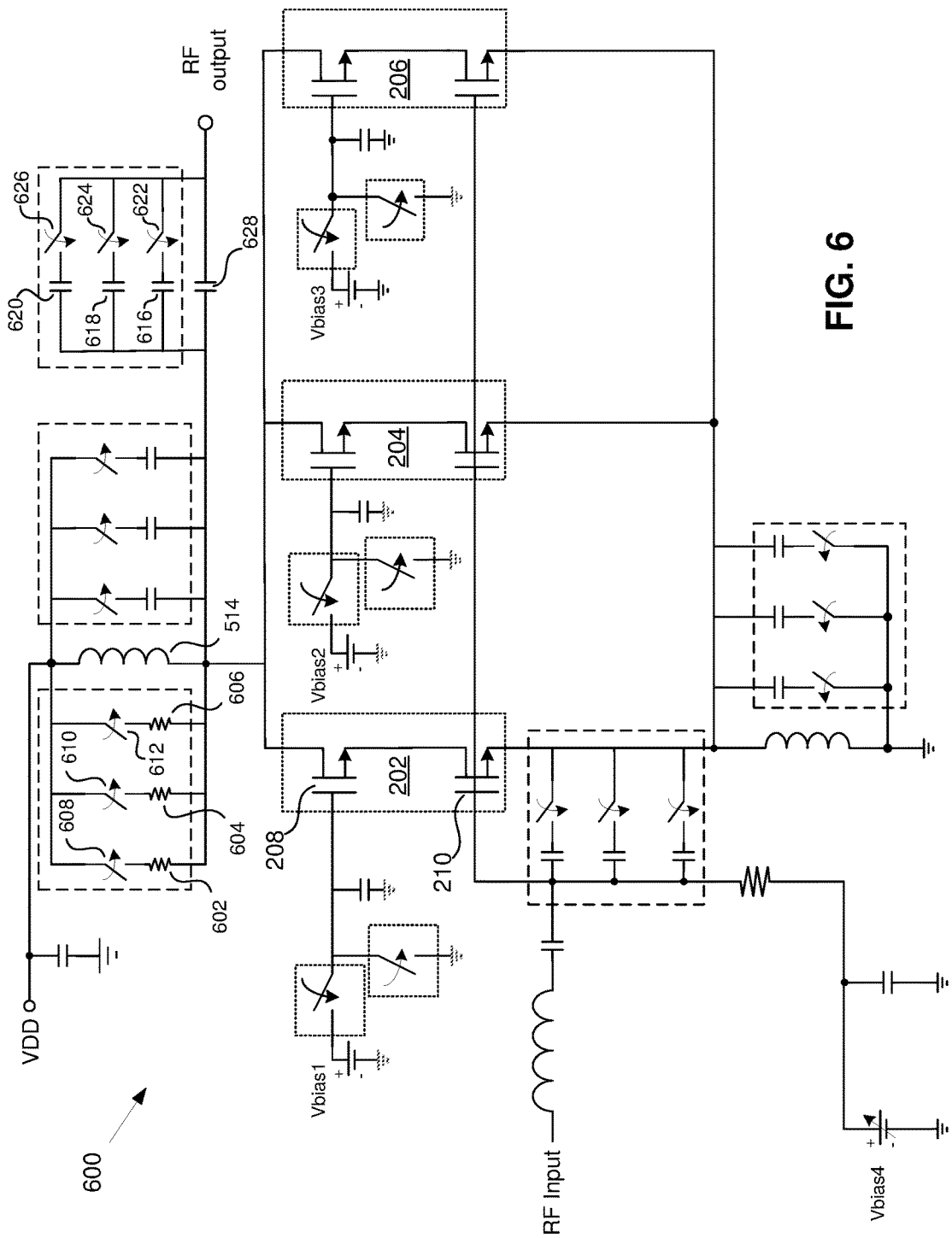
FIG. 6 is an illustration of the LNA of FIG. 5, additionally having a bank of gain control resistors and a bank of gain control compensation capacitors.

FIG. 6 is an illustration of yet another embodiment of an LNA 600 having a bank of gain control resistors 602, 604, 606. Each of the gain control resistor 602, 604, 606 is associated with a gain control switch 608, 610, 612 that places the associated gain control resistor 602, 604, 606 in parallel with the load inductor 514. By closing the switch 608, 610, 612 associated with each of the gain control resistors 602, 604, 606, the gain of the LNA 600 can be reduced, providing additional control over the gain of the LNA 600. Unlike the switches 408, 410, 412, 508, 510, 512 that are each associated with one of the branches 202, 204, 206, the gain control switches 608, 610, 612 can be operated independently to provide additional gain modes. However, the same gain control module 218 used to turn the branches on and off can provide additional control outputs that open and close the switches 608, 610, 612. Adding additional gain control resistor in parallel with the load inductor 514 will change the output impedance of the LNA 600. Accordingly, in some embodiments, an additional degree of freedom to alter the output impedance is provided by a bank of gain control compensation capacitors 616, 618, 620, each associated with a switch 622, 624, 626 that can place the associated capacitor in parallel with an output capacitor 628. The gain control compensation capacitors 616, 618, 620 are tuned to have values that will mitigate changes to the output impedance that would otherwise occur for each combination of gain control switches being opened or closed. Providing the gain control compensation capacitors 616, 618, 620 makes it possible to keep the output impedance essentially the same when different combinations of gain control resistors 602, 604, 606 are placed to be in parallel with the load inductor 514.

Figure 7:
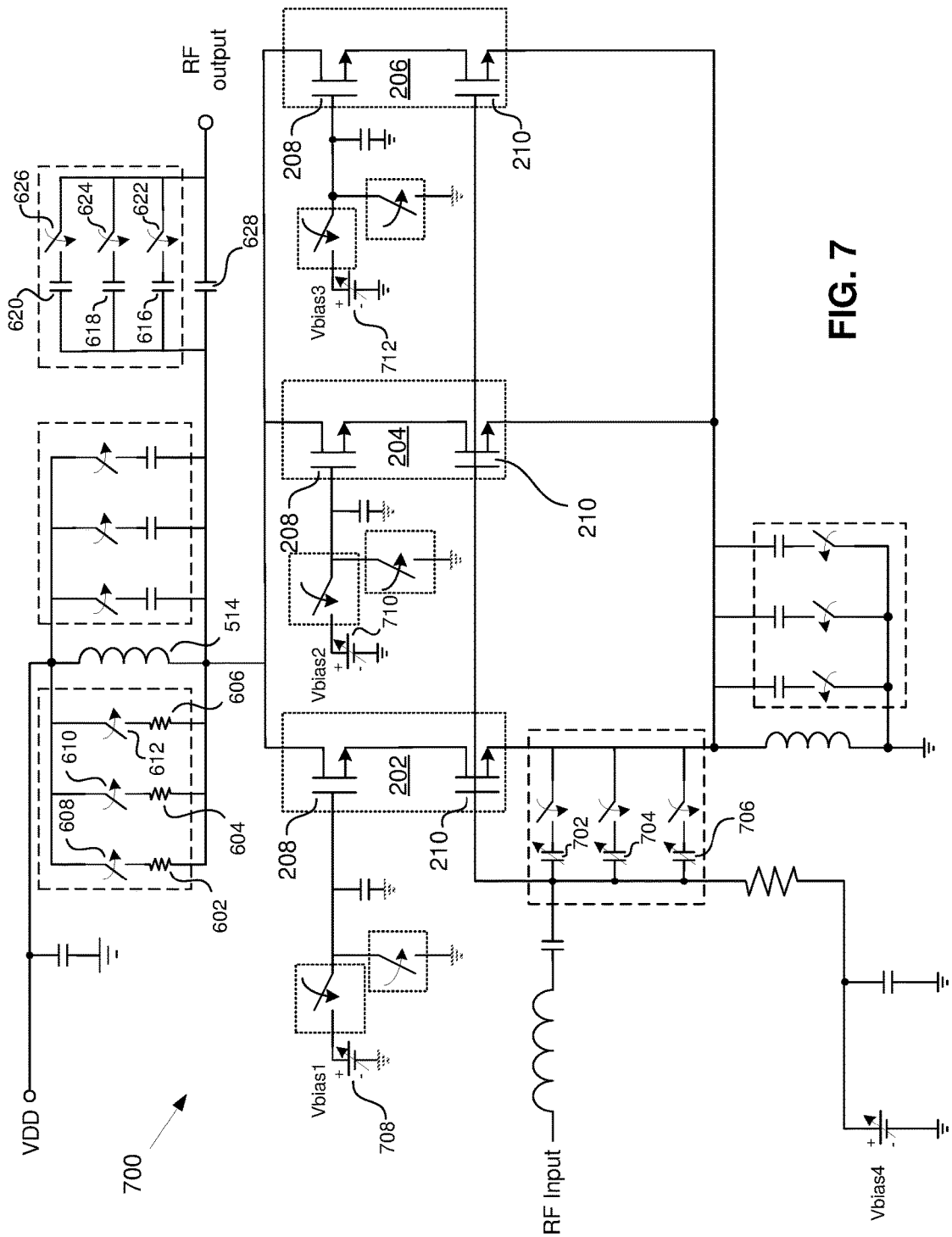
FIG. 7 is an illustration of the LNA of FIG. 6, additionally having a bank of post fabrication variable capacitors selectively placed in parallel with the gate to source capacitance CGS of the three common source amplifiers

FIG. 7 is an illustration of one more embodiment of an LNA 700 in which a bank of variable capacitors 702, 704, 706 are selectively placed in parallel with the gate to source capacitance CGS of the three common source amplifiers, such as FETs 210. In some embodiments, the capacitors 702, 704, 706 are "post fabrication variable". That is, the amount of capacitance can be adjusted after fabrication of the other components of the amplifier branch 202, 204, 206. By making the value of these capacitors 702, 704, 706 variable, variations during fabrication that can affect parameters of interest of the LNA 700 (such as the IIP3, noise figure, input second order intercept (IIP2), output impedance, input impedance, etc.) can be compensated for after fabrication is complete. In some embodiments, the capacitors 702, 704, 706 are each Metal-Insulator-Metal (MIM) caps that can be laser trimmed to the desired capacitance after the LNA 700 has been fabricated. Alternatively, additional capacitors and associated switches can be provided to increase the range of capacitance that can be varied after fabrication with selectively coupling the additional capacitors through the additional switches. The capacitors 702, 704, 706 are shown in FIG. 7 as three variable capacitors. However, in some embodiments, each capacitor 702, 704, 706 may comprise a fixed capacitor in parallel with (or in series with) a MIM capacitor that can be laser trimmed to yield the desired total capacitance for each capacitor 702, 704, 706 shown or several additional capacitors and associated switches. In addition, the bias voltages $V_{bias1}$, $V_{bias2}$ and $V_{bias3}$ applied to the gate of each of the three common gate amplifiers (such as FETs 208) are each generated using variable voltage sources 708, 710, 712.

Throughout this disclosure, the terms "resistor", "capacitor" and "inductor" have been used in the general sense to indicate an element that imposes resistance, capacitance and inductance, respectively. It should be understood that these terms can be interpreted to mean any element, either lumped or distributed, that can impose resistance, capacitance and inductance, respectively. Likewise, the term "switch" has been used through the disclosure to mean any circuit element that can selectively impose either a relatively high impedance in a first state and a relatively low impedance in a second state. In some embodiments, these switches are FETs. However, any other element capable of switching from a relatively high impedance to a relatively low impedance can be used where practical.

Figure 8:
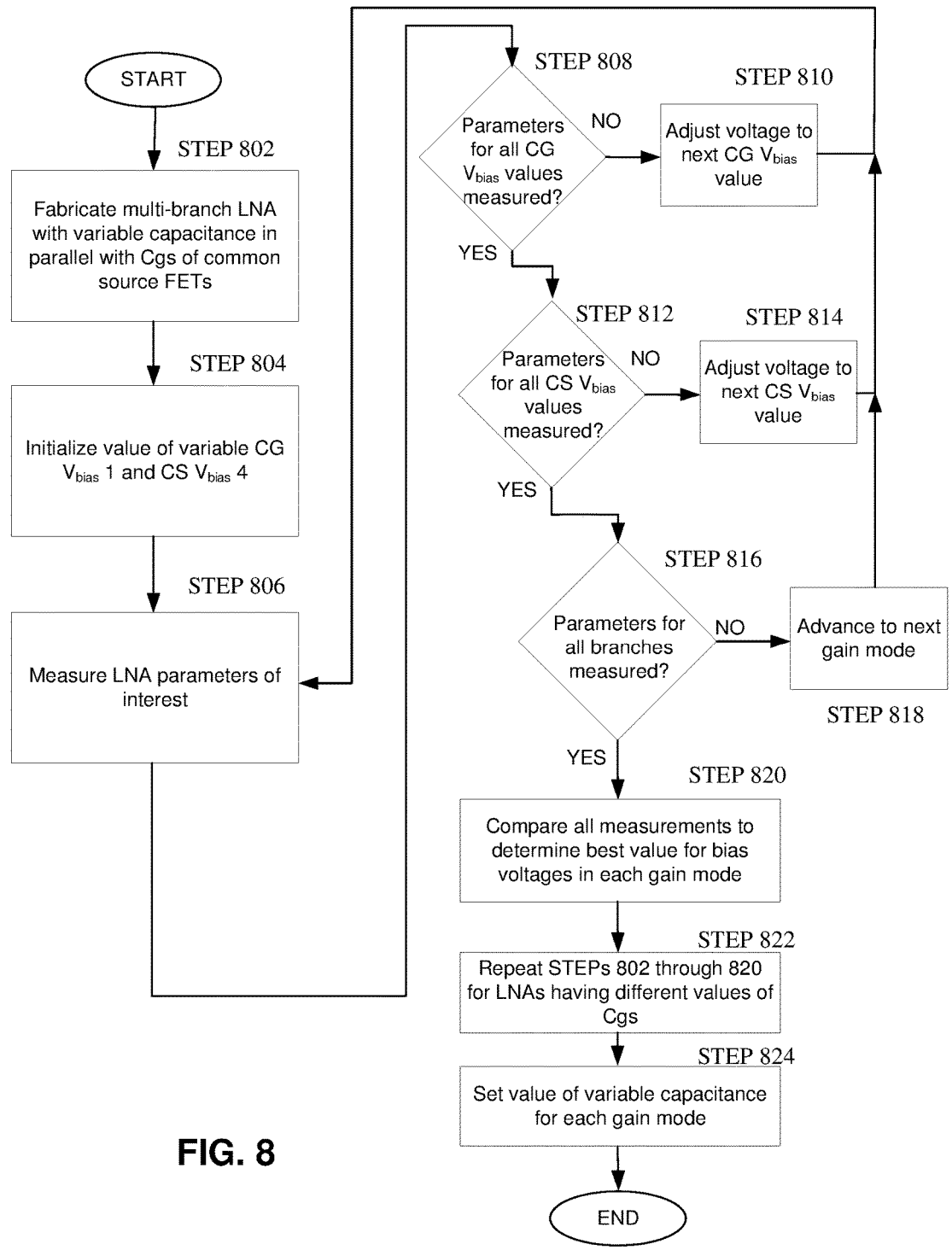
FIG. 8 is a flowchart of a process used to make an LNA having capacitors tuned to values that account for variations in the parameters of components of the LNA during fabrication of the LNA.

FIG. 8 is a flowchart of a process used to make an LNA 700 having capacitors 702, 704, 706 tuned to values that account for variations in the parameters of components of the LNA during fabrication of the LNA 700. The process begins with the fabrication of LNAs 700 including capacitors 702, 704, 706 that can be adjusted, such as by laser trimming a MIM capacitor, after fabrication (STEP 802). Once the LNAs 700 have been fabricated, at least one of the LNAs 700 is selected. For the selected LNA 700, initial values are set for capacitance for the three capacitors 702, 704, 706 and for the common gate (CG) bias voltage $V_{bias1}$, $V_{bias2}$ and $V_{bias3}$ applied to each of the common gate FETs 208 and for the common source (CS) bias voltage $V_{bias4}$ applied to the common source FETs 210 (STEP 804).

Next, at least one LNA parameter of interest, such as the IIP3, noise figure, input second order intercept (IIP2), output impedance, input impedance, etc., are measured at the initial values of CG bias and CS bias for a first gain mode in which the first branch 202 is turned on and each of the other branches 204, 206 are turned off (STEP 806). If measurements have not been made at all of the CG bias voltages for which measurements are to be made (STEP 808), then the CG bias voltage for the branch that is currently turned on is adjusted to the next value (STEP 810). The parameters of interest are measured for that CG bias voltage (STEP 806). STEPs 806, 808 and 810 are repeated until the answer to the decision block in STEP 808 is "YES" (i.e., parameter measurements for all of the bias voltage levels have been made).

Upon making measurements of the parameters of interest at each CG bias voltage level, a decision is made as to whether parameter measurements have been made for all of the CS bias voltage values (STEP 812). If not, then the CS bias voltage is set to the next level at which parameter measurements are to be made (STEP 814). The next measurement is made (STEP 806) and the process again repeats STEP 806 through STEP 814 until the answer to the decision block in STEP 812 is "YES".

Once the answer to the decision block in STEP 812 is "YES", a determination is made as to whether parameter measurements for all of the branches 202, 204, 206 have been completed. If not, then the next branch is turned on and each of the other branches is turned off (STEP 818). Once the answer to the decision block in STEP 816 is "YES", the parameter measurements are analyzed to determine the CS bias voltage and CG bias voltage that results in desired operational parameters of the components of the LNA 700 (STEP 820).

The process performed in STEPs 802 through 820 are repeated for other LNAs 700 from the same fabrication lot (i.e., that were fabricated together and thus have the same operational characteristics), but with different values of capacitance for the capacitors 702, 704, 706. This process is repeated until parameters of interest for LNAs 700 having all desired values of capacitance for the post fabrication variable capacitors 702, 704, 706 have been measured (STEP 822). The parameter measurements are then analyzed to determine the amount of capacitance (e.g., the size) of the variable capacitors 702, 704, 706 necessary to compensate for any variations from the ideal operational parameters of the LNA 700. The value of each of the variable capacitors 702, 704, 706 for the remaining LNAs of the lot are then set (STEP 824). In some embodiments, the capacitors 702, 704, 706 are MIM capacitors that can be laser trimmed, as noted above. Therefore, the values are set by laser trimming each capacitor to the appropriate size indicated by the parameter measurements made in STEP 806.

In some embodiments, the process of FIG. 8 is performed on samples taken from a lot of LNAs that were fabricated together (i.e., LNAs for which the components all have the same performance parameters). The MIM capacitor of each of the samples can be trimmed to different values and the process of FIG. 8 performed on each sample to determine which sample has the most desirable parameters of interest. In some embodiments, the MIM capacitor 702, 704, 706 of a first sample can be trimmed to a size that provides values of 20% of the impedance resulting from $C_{gs}$ of the common source FET 210. Other samples can have the capacitors 702, 704, 706 trimmed to other values, such as 30%, 40% or 0% of $C_{gs}$. Once the measurements of STEP 806 are all completed for each sample, the sample having the best operational characteristics can be used as a model for determining the size of the capacitors 702, 704, 706. In some embodiments, the MIM capacitors of the remaining LNAs 700 that were fabricated together with the samples that were measured are trimmed to the same value as the LNA 700 having the best measurements for the particular application for which the LNA 700 is to be used. Alternatively, a new LNA 700 can be designed based on the measurements made on the samples and the process repeated using the new design and taking samples from the resulting LNAs 700.

Fabrication Technologies and Options

As should be readily apparent to one of ordinary skill in the art, various embodiments of the disclosed apparatus can be implemented to meet a wide variety of specifications. Unless otherwise noted above, selection of suitable component values is a matter of design choice and various embodiments of the claimed invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, in some cases, the concepts claimed may be particularly useful with an SOI-based fabrication process (including SOS), and with fabrication processes having similar characteristics.

A number of embodiments of the claimed invention have been described. It is to be understood that various modifications may be made without departing from the spirit and scope of the claimed invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. An amplifier comprising:
    (a) a plurality of amplifier branches at least one which includes a plurality of FETs;
    (b) a plurality of branch control switches, each branch control switch coupled to a corresponding amplifier branch;
    (c) a load inductance coupled between a drain of a common-gate amplifier and a voltage supply and a plurality of gain control resistors selectively placed in parallel with the load inductance; and
    (d) a plurality of gain control compensation switches, each gain control compensation switch corresponding to one of a plurality of gain control compensation capacitors and coupled to the corresponding gain control compensation capacitor to place the corresponding gain control compensation capacitor in parallel with an output capacitor when the corresponding gain control compensation switch is closed.

2. The amplifier of claim 1, wherein the output capacitor is coupled between the drain of the common-gate amplifier and an RF output.

3. The amplifier of claim 2, further comprising a plurality of gain control switches, each gain control switch associated with a corresponding one of the gain control resistors to place the associated gain control resistor in parallel with the load inductor to select a corresponding gain mode when the associated gain control switch is closed.

4. The amplifier of claim 3, wherein the amplifier has an output impedance, wherein closing unique combinations of gain control switches corresponds to unique gain modes and wherein combinations of the gain control compensation capacitors are tuned to mitigate changes between the output impedance in each of the possible gain modes.

5. Method for fabricating and tuning a low noise amplifier (LNA), the method comprising:

(a) fabricating a plurality of LNAs, each LNA having at least one amplifier branch, the at least one amplifier branch having at least a common gate amplifier, a common source amplifier and a post fabrication variable capacitor in parallel with the gate to source capacitance of the common source amplifier;
(b) for a first LNA of the plurality of LNAs, adjusting the capacitance of each of the post fabrication variable capacitors to a first capacitance value;
(c) applying an initial CS bias voltage to the common source amplifier of the first of the at least one amplifier branches of a first of the plurality of LNAs;
(d) applying an initial CG bias voltage to the common gate amplifier of a first of the at least one amplifier branches to turn the first amplifier branch;
(e) measuring LNA parameters of interest;
(f) adjusting the CG bias voltage;
(g) repeating steps (d) and (e) until measurements at all desired CG bias voltage values have been made;
(h) adjusting the CS bias voltage;
(i) measuring LNA parameters of interest;
(j) repeating steps (c) through (h) until measurements at all desired CS bias voltage values have been made;
(k) repeating steps (c) through (i) for each of the remaining at least one amplifier branches;
(l) comparing the measurements to determine a desired CG bias voltage and CS bias voltage;
(m) for a next LNA from among the plurality of LNAs, adjusting the capacitance of each of the post fabrication variable capacitors to a next capacitance value;
(n) repeating (c) through (m) until parameters of interest for LNAs having all desired values of capacitance for the post fabrication variable capacitors have been measured;
(o) determining the desired values of capacitance for the post fabrication variable capacitors based on the measurements of the parameters of interest; and
(p) adjusting the capacitance of the post fabrication variable capacitors of each of the remaining LNAs to the value determined in (o).

6. The method of claim 5, further comprising fabricating additional LNAs, each of the additional LNAs having at least one amplifier branch, the at least one amplifier branch having at least a common gate amplifier, a common source amplifier and a post fabrication variable capacitor in parallel with the gate to source capacitance of the common source amplifier, wherein the characteristics of the post fabrication variable capacitor are determined based on the measurements made on the previously fabricated LNAs.

7. The method of claim 6, further comprising repeating (b) through (p) of claim 5 for the additional LNAs.

\* \* \* \* \*